United States Patent
Wang et al.

(10) Patent No.: US 7,797,618 B2
(45) Date of Patent: Sep. 14, 2010

(54) PARALLEL DECODER FOR ULTRAWIDE BANDWIDTH RECEIVER

(75) Inventors: Bo Wang, North Potomac, MD (US); Adrian R. Macias, Oceanside, CA (US)

(73) Assignee: Freescale Semiconductor, Inc., Austin, TX (US)

( * ) Notice: Subject to any disclaimer, the term of this patent is extended or adjusted under 35 U.S.C. 154(b) by 989 days.

(21) Appl. No.: 11/024,804

(22) Filed: Dec. 30, 2004

(65) Prior Publication Data

US 2006/0150057 A1 Jul. 6, 2006

(51) Int. Cl.
H03M 13/23 (2006.01)
H03M 13/41 (2006.01)

(52) U.S. Cl. ..................................... 714/795
(58) Field of Classification Search .................. 714/795
See application file for complete search history.

(56) References Cited

U.S. PATENT DOCUMENTS

| | | | | |
|---|---|---|---|---|
| 5,295,142 | A * | 3/1994 | Hatakeyama | 714/794 |
| 5,841,819 | A * | 11/1998 | Hu et al. | 375/341 |
| 5,881,075 | A * | 3/1999 | Kong et al. | 714/795 |
| 6,259,749 | B1 * | 7/2001 | Andoh | 375/341 |
| 6,304,617 | B1 * | 10/2001 | Okamoto | 375/341 |
| 6,317,472 | B1 * | 11/2001 | Choi et al. | 375/341 |
| 6,477,680 | B2 * | 11/2002 | Mujtaba | 714/795 |
| 6,697,443 | B1 * | 2/2004 | Kim et al. | 375/341 |
| 6,865,710 | B2 * | 3/2005 | Bickerstaff et al. | 714/796 |

OTHER PUBLICATIONS

Kubota, S., et al., "Novel Viterbi Decoder VLSI Implementation and its Performance", IEEE Transactions on Communications, No. 8, Aug. 1993, 1170-1178.*
Chang, Y-N., et al., "A 2-Mb/s 256-State 10-mW Rate-1/3 Viterbi Decoder", IEEE Journal of Solid-State Circuits, vol. 35, No. 6, Jun. 2000, pp. 826-834.*
Viterbi, A., "An Intuitive Justification and a Simplified Implementation of the MAP Decoder for Convolutional Codes", IEEE Journal on Selected Areas in Communications, vol. 16, No. 2, Feb. 1998, pp. 260-264.*
Notification of Transmittal of the International Search Report and the Written Opinion of the International Searching Authority, or the Declaration from Patent Cooperation Treaty issued on Jul. 12, 2006 for the corresponding International patent application No. PCT/US05/44973.
International Search Report from Patent Cooperation Treaty issued on Jul. 12, 2006 for the corresponding International patent application No. PCT/US05/44973.
Written Opinion of the International Searching Authority from Patent Cooperation Treaty issued on Jul. 12, 2006 for the corresponding International patent application No. PCT/US05/44973.
Notification Concerning Transmittal of International Preliminary Report on Patentability dated Jul. 12, 2007 in cooresponding PCT application No. PCT/US2005/045543.

* cited by examiner

*Primary Examiner*—Stephen M Baker (57) ABSTRACT

A method (700) and apparatus (600) are described for performing parallel decoding in connection with $2^{M-1}$ parallel ACS unit in ACS unit (110), track buffer (112) and voting unit (114) in an Ultrawide Bandwidth (UWB) receiver having a parallel trellis decoder for decoding a message sequence encoded according to a convolutional code. Outputs from the track buffer can be input to a voting unit (114) where a voting scheme can be applied and a decision rendered as to the originally transmitted message sequence.

17 Claims, 4 Drawing Sheets

PARALLEL DECODER FOR ULTRAWIDE BANDWIDTH RECEIVER

CROSS-REFERENCE TO RELATED APPLICATIONS

The present invention is related to co-pending applications entitled "TRACK BUFFER IN A PARALLEL DECODER," filed Dec. 30, 2004, Ser. No. 11/024,805 and "DECISION VOTING IN A PARALLEL DECODER," filed Dec. 30, 2004, Ser. No. 11/024,803, the contents of both of which are hereby incorporated by reference in their entirety.

FIELD OF THE INVENTION

The present invention relates in general to wireless communication systems, such as ultrawide bandwidth (UWB) systems, including UWB receivers, mobile receivers and transceivers, centralized receivers and transceivers, and related equipment. More specifically, the present invention relates to a parallel decoder used in such devices to decode received UWB signals encoded according to a code such as a convolutional code.

BACKGROUND OF THE INVENTION

As ultrawide bandwidth (UWB) communication becomes increasingly desirable for wireless devices due to its speed and capacity combined with its resilience to interference within high-frequency bands, it is increasingly necessary to adopt effective error correction and related coding methods for maintaining step with the high accuracy demands associated with UWB communication. It should be noted that a UWB signal may be defined, in accordance with, for example, The Federal Communications Commission "First Report and Order, Revision of Part 15 of the Commission's Rules Regarding Ultra-Wideband Transmission Systems," ET Docket 98-153, Feb. 14, 2002 as any signal occupying more than 500 MHz in the unlicensed 3.1-10.6 GHz band and meeting a specified energy spectrum or energy spectral density mask. As with many engineering challenges, two predominant constraints guide design activities associated with a UWB system: application speed and power consumption. To address these concerns, various coding schemes can be used to optimize speed and error resiliency while maintaining power consumption at acceptable levels. Thus coding performance and complexity are of great concern in UWB systems.

Convolutional codes are a common choice for coding a continuous sequence of message symbols and provide useful coding performance for UWB systems. For many reasons, convolutional codes can provide power savings due to inherent characteristics of the code and because the error correcting capabilities of the code reduce the requirement for retransmission which can also contribute greatly to saving power on both the transmitter and receiver sides. As will be appreciated by one of ordinary skill, in a convolutional encoder, one message symbol of k bits can be encoded into one code symbol of n code bits, with k and n typically being small integers and with k<n, resulting in a code with a rate of k/n. A typical encoder can be constructed as a shift register plus a series of n connection groups to n summing nodes which produce an n-bit codeword output based on a message symbol input bit and the contents of the shift register. The constraint length K of the encoder is generally taken to be the length of the encoder shift register plus one. Another common parameter used in describing encoders is M which is taken to mean the number of shift register or memory elements. Thus, in the case of a code with a rate of ½, and a constraint length of M=3 (K=4), a typical convolutional encoder for such a code can be described as, for example, a finite state machine (FSM) with $2^M$, or 8 states.

In a conventional trellis decoder used for decoding convolutionally encoded signals, the speed at which at which a codeword can be processed is proportional to the trellis depth, or the number of possible state transitions required to converge on the correct message word. Thus for code symbols received at a code rate $r_n$, a decoding operation must perform fast enough to generate the recovered message symbol at the message symbol rate $r_k$. Since, in a conventional decoder such as, for example, a trellis decoder, decisions are made only after the trellis is traversed and the surviving path calculated, the trellis depth can have a large impact on the processing speed required to meet the requirement of generating recovered symbols at the symbol rate. A trellis depths even as short as 2 or 3, double and triple the processing speed required to decode the message symbol at the original message symbol rate leading to unsuitable decoding speeds for high speed transmissions such as transmissions within the UWB symbol rate ranges. Since the trellis depth is a function of the constraint length of the code, and can affect the Forward Error Correction (FEC) capability of the code, along with other desirable features of the code, it would be desirable in the art for a method and apparatus for rapidly decoding a received sequence encoded according to a convolutional code without sacrificing the power savings and other benefits associated with code constraint selection.

BRIEF DESCRIPTION OF THE DRAWINGS

The accompanying figures, where like reference numerals refer to identical or functionally similar elements throughout the separate views and which together with the detailed description below are incorporated in and form part of the specification, serve to further illustrate various embodiments and to explain various principles and advantages in accordance with the present invention.

DETAILED DESCRIPTION OF PREFERRED EMBODIMENTS

The present invention provides comparatively low complexity, low power consumption and high speed forward error correction (FEC) in UWB receivers through the use of decoding such as, trellis decoding, Viterbi decoding, maximum likelihood decoding, and the like, of a convolutionally encoded message sequence. The parallel trellis decoder reduces decoding time and decoding power consumption by eliminating the need to iteratively compute decoder trellis traversals and by maintaining a surviving path metric for a series of parallel computation units. Thus, decoded message symbols can be generated at approximately the symbol rate, taking into account certain latency, at reasonable power levels, an achievement which is not generally possible using alternate designs such as conventional iterative, that is, non-parallel, decoder designs including some designs which purport to be at least partially parallel. The present invention accomplishes fast decoding while maintaining acceptable power levels and error correction performance levels associated with convolutional coding.

Figure 1:
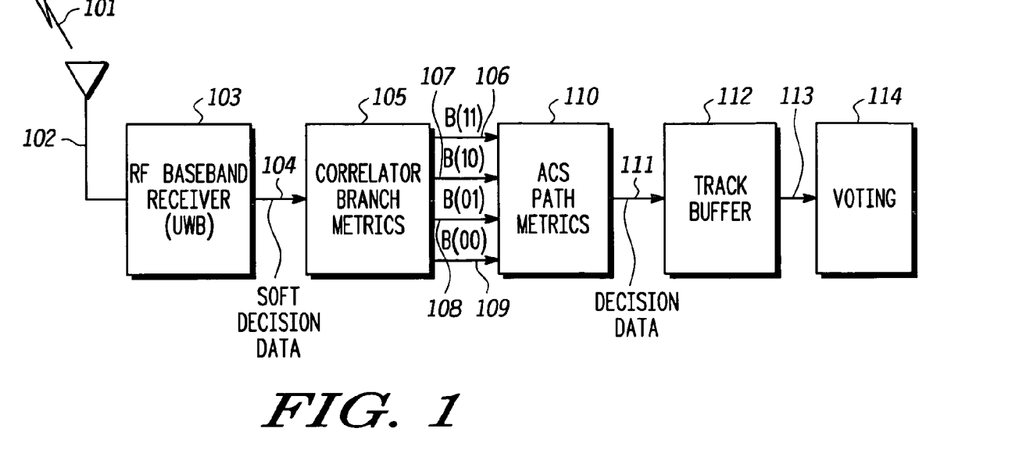
FIG. 1 is a block diagram illustrating blocks associated with an exemplary Ultra Wide Band (UWB) receiver in accordance with various exemplary embodiments of the present invention.

A series of stages in an exemplary receiver 100 is shown in FIG. 1. As will be appreciated by those of ordinary skill in the art, convolutional codes as noted above are generated by subjecting a sequence of message symbols to coding operations in a convolutional encoder (not shown). The convolutional encoder applies n generator polynomials to the message sequence to generate a code word having n symbols for every message symbol. A typical convolutional encoder is configured either in hardware, in software, or in a combination of hardware and software, as a linear shift register with M storage locations and n different sets of connections between n respective summation nodes and various combinations of registers within the shift register corresponding to n respective generator polynomials. Each connection set corresponds to a generator polynomial and is associated with one of the n code symbol outputs associated with code words of the convolutional code. In a ½ rate code, for example, 2 code symbols are generated for every 1 received message symbol and thus 2 sets of connections to the encoder shift register corresponding to the generator polynomials for the code are used to generate the 2 code symbols for each code word.

Each of the unique sets of connections to the input shift register associated with the $n^{th}$ generator are exclusive ORed to form the code symbol for the $n^{th}$ generator and the n code symbols from the n code generators are multiplexed such that n code symbols are generated for every k input symbols at the input symbol rate. Code symbols are transmitted at baseband frequency and received as a UWB signal 101 at an exemplary receiver 100.

As noted above and as shown in Table 1, in accordance with various exemplary embodiments, a message sequence can be encoded with a convolutional code with a rate of ½, and having a constraint length K=6 to achieve a good range performance for various modes. Given a code rate of ½, or a punctured rate of, for example, ¾ for optional modes, the choice of constraint K=6 offers an excellent performance vs. complexity trade-off, requiring, for example, only half the complexity of a code with a constraint K=7. It should incidentally be noted that a convolutional code used in connection with a convolutional interleaver can de-correlate initial demodulator errors, thereby maximizing the FEC benefits associated with the code.

TABLE 1

| Data Rate | FEC Rate | Code Length | Range (AWGN) |
|---|---|---|---|
| 9.2 Mbps | ½ | 24 | 29.3 m |
| 28 Mbps | ½ | 24 | 29.4 m |
| 55 Mbps | ½ | 12 | 22.1 m |
| 110 Mbps | ½ | 6 | 18.3 m |
| 220 Mbps | ½ | 3 | 12.9 m |
| 500 Mbps | ¾ | 2 | 7.3 m |
| 660 Mbps | 1 | 2 | 3 m |
| 1000 Mbps | ¾ | 1 | 5 m |
| 1320 Mbps | 1 | 1 | 2 m |

Table 1 shows supported data rates for low band operation in accordance with various exemplary embodiment of the present invention. The information in Table 1 is based on assumptions for range estimates that include transmit power adjustments for code word spectrum (transmit back-off of 1.2-1.9 dB), 6.6 dB CMOS noise figure for receiver, 2.5 dB implementation loss for data rates up to 220 Mbps (3 dB implementation loss for rates >=500 Mbps) and the like.

The UWB signal 101 can be received at an antenna 102 and input to an RF baseband UWB receiver 103 where soft decision decoding as will be understood to those of skill in the art can be performed on baseband signals associated with the UWB signal 101 to generate soft decision data 104 for input to, for example, a correlator/branch metrics block 105. It will be appreciated that during correlation, branch metrics can be generated identifying the Euclidian distance for the possible combination of the 2 prospective received code bits. Thus, four branch metric values associated with the four possible combinations of the two soft decision bits are shown as b(11) 106, b(10) 107, b(01) 108 and b(00) 109 are generated in the correlator/branch metrics block 105 and input with their respective distances or metric values to Add Compare Select (ACS) path metric block 110. It will be appreciated that the branch metric values will be used in the ACS path metric block 110 based on a butterfly connection associated with the particular code parameters. Surviving path metrics are calculated in the individual parallel ACS elements as will be described in greater detail herein after.

When surviving states or path metrics are selected in a series of parallel or butterfly connected ACS elements, the states or metrics accumulated in a corresponding series of registers in an exemplary track buffer 112 which is described in greater detail in the related, co-pending application entitled "TRACK BUFFER IN A PARALLEL DECODER" Ser. No. 11/024,805 noted herein above. As more information is received by cycling or spinning the ACS units on the present received symbol, the accumulated surviving path metrics can be rearranged in the track buffer using register exchange techniques within the track buffer. The contents of the track buffer will contain decisions regarding the best estimate of the output symbol for each track corresponding to the outputs of the ACS units. The decisions represent the symbol regarded by operation of branch metric calculation for each ACS unit as the maximum likelihood received symbol. In addition, a voting block 114 which is the subject of the related, co-pending application entitled DECISION VOTING IN A PARALLEL DECODER" Ser. No. 11/024,803 as noted above, can be configured to analyze the contents of the track buffer 112 after a number of cycles and determine an output decision symbol. It should be noted that while the present invention is directed primarily to parallel ACS decoding, some aspects of the track buffering and voting will be discussed but only, for example, as they relate to parallel decoding.

Figure 2:
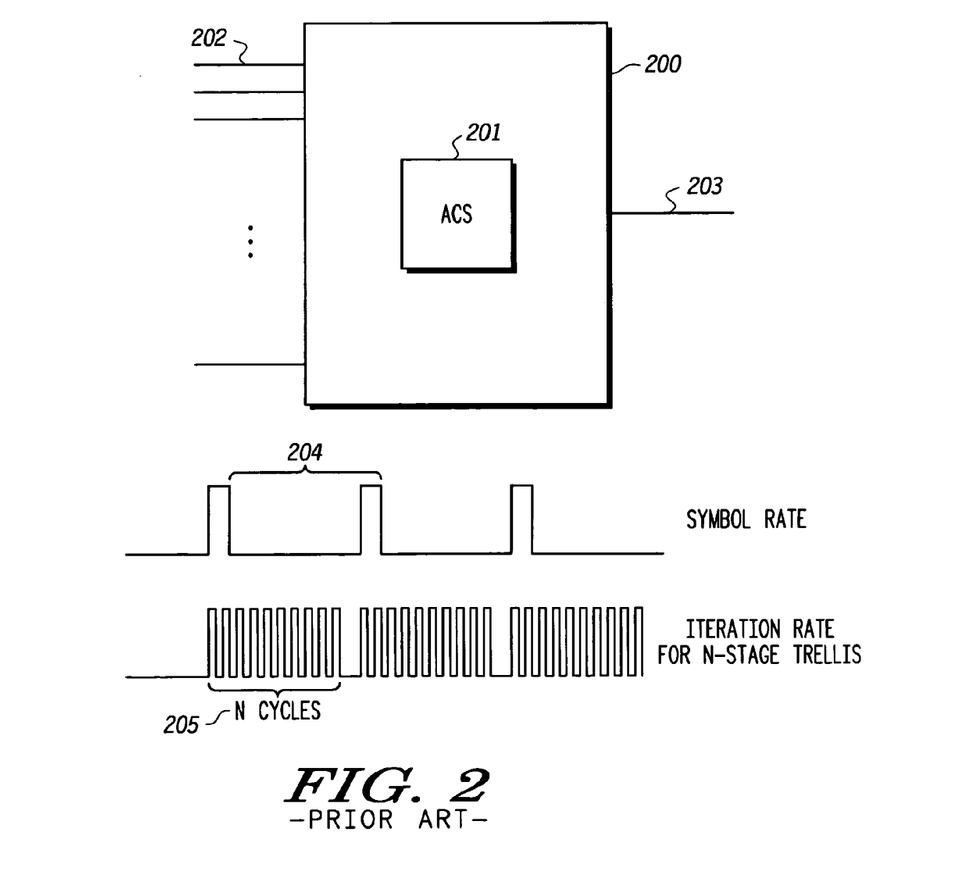
FIG. 2 is a diagram illustrating an exemplary timing relationship between a received symbol rate and iteration rates required for decoding in conventional decoders using Add Compare Select (ACS) elements.

It is important to note that in a conventional trellis decoder, as shown for example in FIG. 2, inputs 202 are applied to a decoder or processor 200 having an iterative ACS calculator 201. A review of the operation of the iterative ACS path metric calculator 201 in comparison to, for example, the output of symbols at output 203, reveals that for symbols output at a symbol rate 204, an n-cycle iteration rate 205 is necessary such that an n-stage trellis can be traversed within the processor 200 in order to generate a decision or output symbol at the symbol rate 204. It can be easily appreciated that for data or symbol rates requiring support under UWB specifications, the n-cycle iteration rate 205 would have to be inordinately fast in order to generate a decision or output symbol at UWB data rates. Also even if the iteration rate was sufficiently fast, the computational complexity of the iterative ACS calculations is unacceptably power consuming. While some documents have described so-called parallel processing cores in relation to ACS decoders, such as in connection with the Institute of Electrical and Electronic Engineering P802.15 working group document P802.15-03/213r0r0, entitled "Implementation of High Speed Signal Processing Cores for 15-3a UWB" dated May 10, 2003, these documents fail to describe a complete parallel connected (butterfly connected) series of ACS elements. In contrast the present invention can be configured for, a UWB system where constraint $2^{M-1}$ parallel connected ACS elements can be present such as in accordance with various exemplary embodiments of the present invention.

Trellis Decoding

As will also be appreciated by one of ordinary skill in the art, a trellis diagram is a useful tool for understanding trellis or Viterbi decoding in accordance with various exemplary embodiments. In a code trellis, rows and columns signify states and stages of operation in accordance with the underlying convolutional code and related FSM. When code words or branch metrics are received, several paths through the trellis can be traversed based on hypothetical state transitions from the present state to the next state for each of a series of possible received sequences. The state transitions will further generate a the most likely corresponding message symbol or sequence associated with the received code sequence. As noted, the rows of an exemplary trellis represent the individual ones of the $2^M$ code states and the columns represent the stages associated with each subsequent received code word during code word intervals. Just as the convolutional encoder, for an exemplary ½ rate code, encoded 2 code symbols (a code word) for each message symbol input to the encoder shift register, the convolutional decoder will attempt to determine the most likely message symbol corresponding to a received code word of by calculating metrics associated with each node in the trellis. As the stages are traversed, distance metrics are accumulated and paths with large metrics are abandoned so that by the "end" of the trellis, that is at the last stage, a path traced back through the trellis will reveal the surviving path and the original message sequence. As noted earlier, in a UWB receiver, waiting until all code words are received is impractical due to the limitations posed by processing speed and symbol rate.

Figure 3:
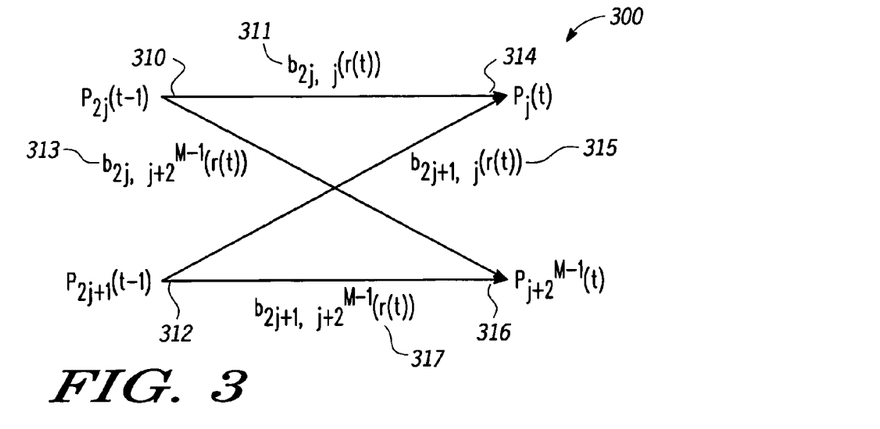
FIG. 3 is a diagram illustrating path and branch metrics associated with an exemplary trellis node in accordance with various exemplary embodiments of the present invention.

An exemplary trellis node 300 is illustrated in FIG. 3. It should be understood that the diagram of exemplary node 300 is a conceptual representation including the inputs and calculations and can be applied generally with each state/stage node in the exemplary decoding trellis. At 310, a path metric $P_{2j}(t-1)$ represents the path metric value carried from the previous stage, that is (t−1) from state 2j. At 312, a path metric $P_{2j+1}(t-1)$ represents the path metric value carried forward from the previous stage (t−1) from state 2j+1. At 311, a branch metric $b_{2j,j}(r(t))$ represents the branch metric associated with a possible traversal of the branch from state 2j to state j given a value r(t) of the received code word. At 315, a branch metric $b_{2j+1,j}(r(t))$ represents the branch metric associated with a possible traversal of the branch from state 2j+1 to state j given a value r(t) of the received code word. Thus at 314, a path metric $P_j(t)$ represents the updated path metric for the current stage (t). If the branch 2j,j is traversed, the value at 314 will be the value of the accumulated path metric $P_{2j}(t-1)$ at 310 and the value of the branch metric $b_{2j,j}(r(t))$ at 311 which is generally the Euclidean distance between the actually received code word and the code state value at j. If the branch 2j+1,j is traversed, the value at 314 will be the value of the accumulated path metric $P_{2j+1}(t-1)$ at 312 and the value of the branch metric $b_{2j+1,j}(r(t))$ at 315 which, as noted, is the Euclidean distance between the actually received code word and the code state value at j. It will be appreciated that the branch metrics can be obtained from the output of correlator/branch metric block 105 described in connection with FIG. 1. Although the exemplary correlator/branch metric block 105 is shown outputting four branch metrics, more can be output depending on the constraint length chosen and the resulting number of code states. In accordance, for example with various exemplary and alternative exemplary embodiments, it has been determined that the decoder of the present invention can use a constraint length of K=6 as noted herein, for achieving superior performance characteristics.

From states 2j and 2j+1, transitions can also be made to state $j+2^M$ through respective branches, the branch from state 2j having a branch metric $b_{2j,j+2}{}^M(r(t))$ at 313 and the branch from state 2j+1 having a branch metric $b_{2j+1,j+2}{}^M(r(t))$ at 317. Thus the value of a path metric $P_{j+2}{}^M(t)$ at 316, if the branch from $2j, j+2^M$ is traversed, is the value of the accumulated path metric $P_{2j}(t-1)$ at 310 and the value of the branch metric $b_{2j,j+2}{}^{M-1}(r(t))$ at 313 which is generally the Euclidean distance between the actually received code word and the code state value at $j+2^{M-1}$. If the branch from 2j+1, $j+2^{M-1}$ is traversed, the value of the path metric $P_{j+2}{}^{M-1}(t)$ at 316 is the value of the accumulated path metric $P_{2j+1}(t-1)$ at 312 and the value of the branch metric $b_{2j+1,j+2}{}^{M-1}(r(t))$ at 317 which is generally the Euclidean distance between the actually received code word and the code state value at $j+2^{M-1}$.

Add Compare Select (ACS)

In traversing an exemplary trellis associated with FIG. 3, various constructs can be used to accomplish the required calculations. One construct is an exemplary Add Compare Select (ACS) circuit 400 shown in FIG. 4. It will be appreciated that ACS circuit 400 can be used to implement the trellis node of FIG. 3. A path metric value $P_{2j}(t-1)$ at 421 and a path metric value $P_{2j+1}(t-1)$ at 422 can be input to an ADD element 401 and an ADD element 402 respectively. Branch metric values, such as a branch metric value $b_{2j,j}(r(t))$ 423 and a branch metric value $b_{2j,j+2}{}^{M-1}(r(t))$ 425 can be input to the ADD element 401 and a branch metric value $b_{2j+1,j+2}{}^{M-1}(r(t))$ 424 and a branch metric value $b_{2j+1,j}(r(t))$ 426 can be input to the ADD element 402 the results of various combinations of calculations for traversed branches can be compared in COMPARE element 403 which can be configured to select using a SELECT line 429 one of a path metric $P_j(t)$ 427 and a path metric $P_{j+2}{}^{M-1}(t)$ 428 as a surviving path.

Figure 5:
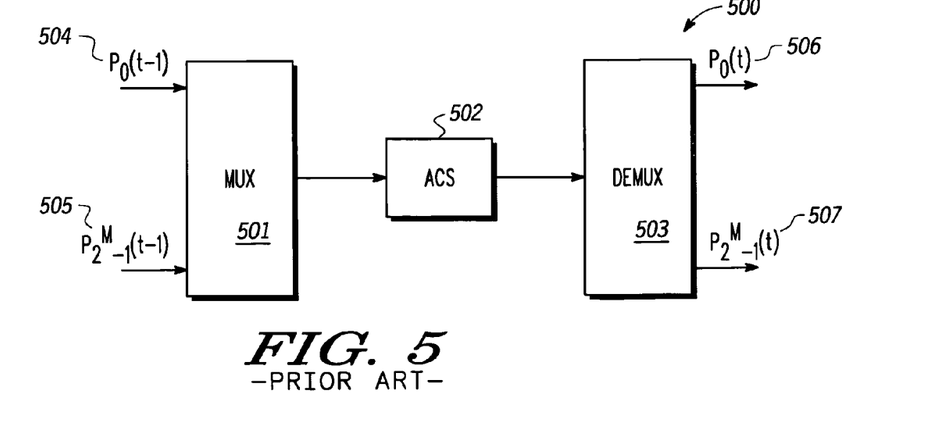
FIG. 5 is a block diagram illustrating an iterative ACS processing configuration associated with conventional decoding.

As previously noted, conventional decoders suffer limitations in that in order to achieve decoding at the symbol rate, the decoder must iterate in order to traverse a trellis, at a rate proportional to K times the symbol rate. FIG. 5 shows a conventional ACS circuit 500 having an input multiplexer 501, an ACS unit 502, and a demultiplexer 503. Input paths representing path metrics from $P_0(t-1)$ 504 to $P_2^M(t-1)$ 505 can be selected for each iteration corresponding for example to each stage for comparison in the ACS unit 502 and a selection made in demultiplexer 503 of surviving path metrics $P_0(t)$ 506 to $P_2^M(t)$ 507. The limitation of such a circuit, as previously noted, is that at symbol rates typically associated with UWB transmissions, the ACS unit 502 would need to iterate at least several time faster than the symbol rate. At best, the conventional ACS unit 502 as noted above, could be configured to process two paths, however this can easily be distinguished from the present invention in that prior art decoders such as decoder 500 of FIG. 5.

Parallel ACS

Although as noted, some discussion exists related to the possible feasibility of processing 2 samples, e.g. branch metrics, in parallel (see, IEEE P802.15 Working Group for Wireless Personal Area Networks, (WPANs) document P802.15-03/213r0r0, entitled "Implementation of High Speed Signal Processing Cores for 15-3a UWB, May 10, 2003), none shows specifically how parallel decoding is accomplished, and all fail to describe individual ACS units connected in parallel to reduce the iteration rate to a value at or near the symbol rate. The document further admits the existence of limitations, for example at above 240 Mbps if such a decoder could be constructed. Also, given the constraints described in various documents in the art, such as K=7, the complexity levels become undesirable as noted, for example, in the discussion herein above. In stark contrast, using the principals discussed and described herein, a parallel trellis decoder can be constructed for providing full symbol rate decoding at 480 Mbps and potentially beyond.

Figure 6:
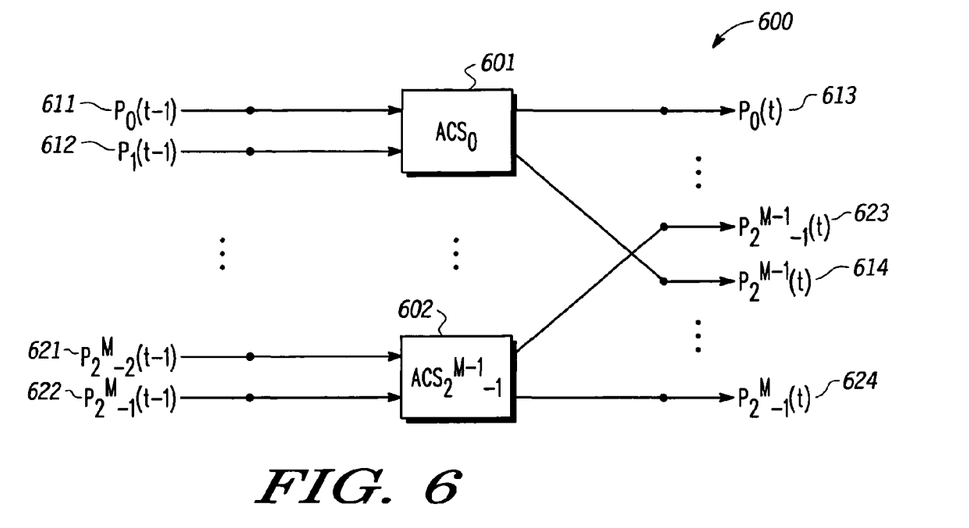
FIG. 6 is a block diagram illustrating exemplary parallel ACS elements associated with parallel trellis decoding in accordance with various exemplary embodiments of the present invention.

FIG. 6 illustrates an exemplary parallel ACS circuit 600 constructed for implementation in, for example, an integrated circuit in a UWB receiver or receiver section such as the ACS branch metrics unit 110 described herein above. In the parallel ACS circuit 600, a series of parallel ACS elements from a first $ACS_0$ element 601 through a $(M-1)^{th}$ $ACS_2^{M-1}{}_{-1}$ element 602 can receive respective parallel path metric inputs $P_0(t-1)$ 611, $P_1(t-1)$ 612 and $P_2^M{}_{-2}(t-1)$ 621, $P_2^M{}_{-1}(t-1)$ 622. Each of the parallel ACS elements such as the $ACS_0$ element 601 and the $ACS_2^{M-1}{}_{-1}$ element 602, after computing branch metrics in the manner described above in connection with FIG. 4, generate parallel path outputs $P_0(t)$ 613, $P_2^{M-1}(t)$ 614 and $P_2^{M-1}{}_{-1}(t)$ 623, $P_2^M(t)$ 624 which are shown schematically in open form as, for example, a butterfly connection as is illustrated in greater detail in FIG. 7.

Figure 7:
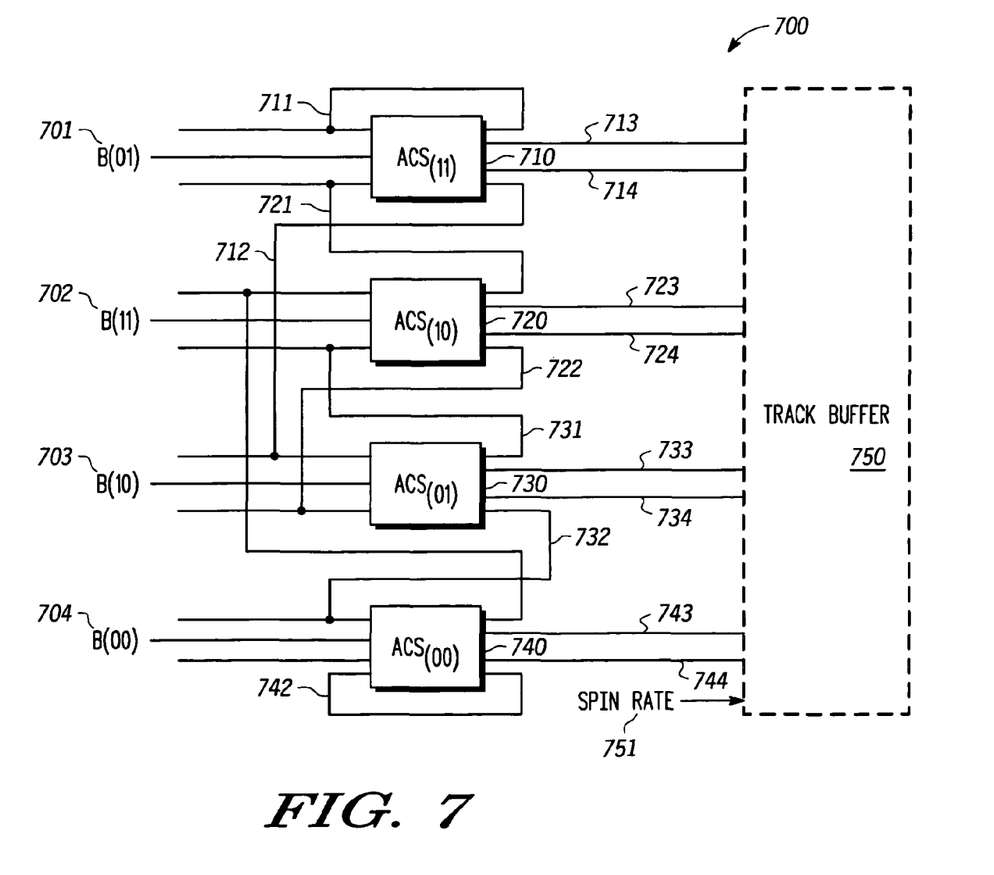
FIG. 7 is a block diagram illustrating exemplary parallel ACS elements associated with parallel trellis decoding of FIG. 6, connected in accordance with various exemplary parameters.

An exemplary decoder, for illustrative purposes, is shown in FIG. 7 for a value of M=3. Accordingly, $2^{M-1}$ or 4 ACS units, such as ACS $unit_{(11)}$ 710, ACS $unit_{(10)}$ 720, ACS $unit_{(01)}$ 730, ACS $unit_{(00)}$ 740, can be parallel, or butterfly connected according to, for example, the configuration as illustrated in FIG. 6 and the particular generator polynomial used for encoding, and can be used to provide decoding for an exemplary convolutional code with $2^M$ or 8 states. It will be appreciated that for various systems and codes, different values of M will result in a different number of ACS units. Further, different generator polynomials, for the same values of M, will result in different butterfly connections between parallel elements, such as ACS $unit_{(11)}$ 710, ACS $unit_{(10)}$ 720, ACS $unit_{(01)}$ 730, ACS $unit_{(00)}$ 740.

Figure 4:
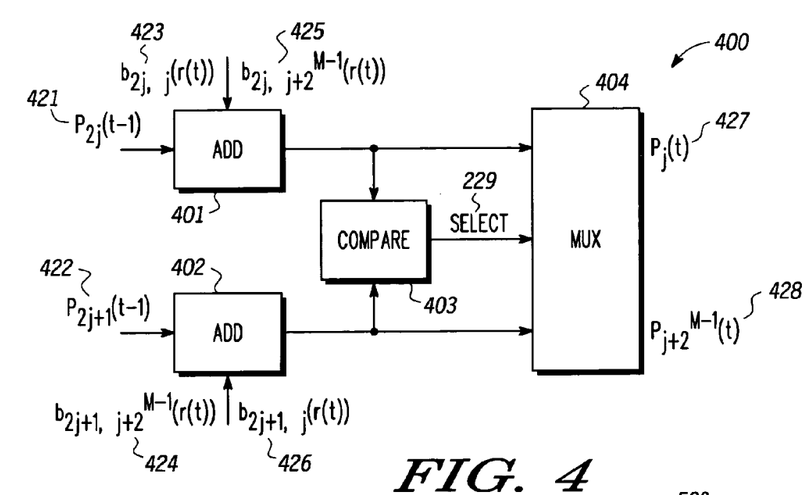
FIG. 4 is a block diagram illustrating inputs to an exemplary Add Compare Select (ACS) element associated with an exemplary trellis node in accordance with various exemplary embodiments of the present invention.

In order to calculate surviving path metrics, branch metric values $b_{(01)}$ 701, $b_{(11)}$ 702, $b_{(10)}$ 703, and $b_{(00)}$ 704, representing for example, the distance metric associated with the present received sequence r(t) and the respective possible sequences of the sequences in the soft decision constellation as will be appreciated by those of ordinary skill, are made available to the ACS units according to for example the relationships illustrated in accordance with FIG. 4 and as shown in FIG. 7. It will be appreciated that inputs to parallel ACS $unit_{(11)}$ 710, ACS $unit_{(10)}$ 720, ACS $unit_{(01)}$ 730, ACS $unit_{(00)}$ 740 can consist of feedback inputs 711, 712, 721, 722, 731, 732, 741, and 742, such as from the previous path metric values, branch metric values $b_{(01)}$ 701, $b_{(11)}$ 702, $b_{(10)}$ 703, and $b_{(00)}$ 704, and state inputs which may be loaded during decoder initialization and the like.

Each ACS unit 710-740 also produces two decision signals 713 & 714, 723 & 724, 733 & 734, or 743 & 744 that are used to control the operation of the track buffer 750. These decision signals are Boolean signals that are indicative of which path metric was selected by the ACS unit 710-740. The track buffer 750 uses these decision signals 713, 714, 723, 724, 733, 734, 743, and 744 to determine how it will manipulate stored values.

It should be noted that the clock rate for an exemplary processor in accordance with various embodiments, is 8.8 nanoseconds and further track buffer 750 may be provided with a spin signal 751 such as a clock signal, cycle signal, or the like at around the processor clock speed to allow the contents of the track buffer to be updated through register exchange or the like as is described in greater detail in copending application "TRACK BUFFER IN A PARALLEL DECODER" Ser. No. 11/024,805.

Figure 8:
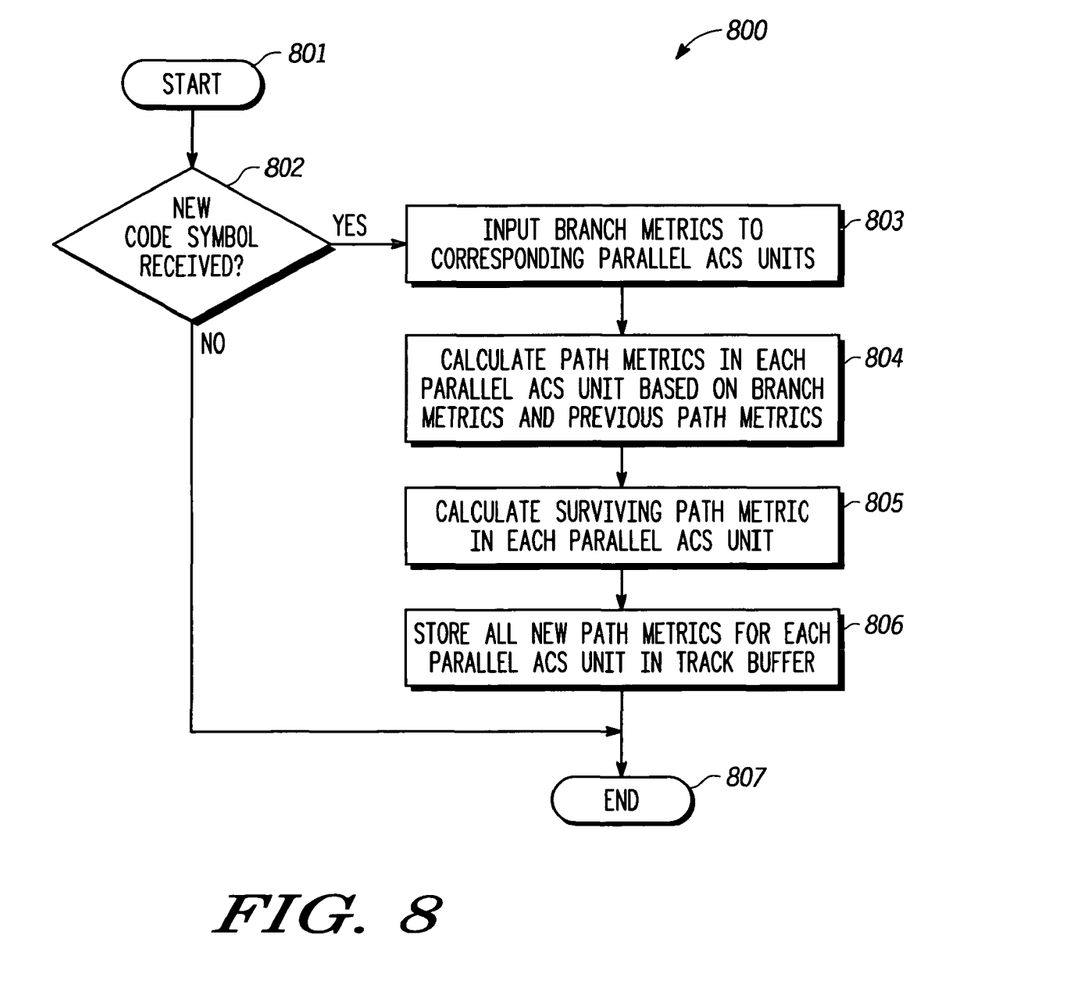
FIG. 8 is a flow chart illustrating exemplary procedures in accordance with various exemplary embodiments of the present invention.

It will be appreciated that in accordance with various exemplary embodiments, the present invention can be practiced as an exemplary procedure, such as procedure 800 as illustrated in FIG. 8. At start 801, it can be determined whether a new code symbol, sequence or the like, has been received at 802. For illustrative purposes, in determining whether a code symbol, sequence, or the like, has been received, it will suffice that new branch metric values, for example as described above, associated with possible received code states will be available at the output of an exemplary correlator/branch metric block such as the correlator/branch metric block 105 as described herein above in accordance with a clock rate, cycle rate, or the like for the decoder. At 803, the branch metric values can be used as needed by the parallel ACS elements in accordance with, for example, the descriptions provided herein above such as the particular code generator used. Using the new branch metric values which, as will be appreciated and as is described herein above, represent the probabilities associated with the four possible received code symbol pairs, the present state information, the path metrics associated with the previous state, new path metrics can be calculated in each of $2^{M-1}$ parallel connected ACS elements and a surviving path selected, for example, as described in connection with the operation of the ACS elements at 804. Although at 805 the procedure is indicated as ending, it will be appreciated that a single "iteration" is shown for illustrative purposes. It is understood that the procedure in accordance with various exemplary embodiments, can continue to repeat, for example, as new branch metric values are received.

Track Buffer and Decision Decoding

The track buffer 112, shown in FIG. 1, can be used to receive the results of the $2^{M-1}$ parallel connected ACS units associated with parallel ACS elements in the ACS path metric block 110/ACS circuit 600, 700 shown in FIGS. 1, 6, and 7. When results are generated from, for example, add elements, in the form of, for example, $2^M$ path metric values, the path metric values can be stored in the track buffer 112 in corresponding $2^M$ registers. As path metric values are generated through the operation of the ACS path metric block 110/ACS circuit 600, 700, the values can be accumulated in a memory element, such as a buffer 510. The accumulated path metric values can be pushed into the buffer through register exchange depending on the value associated with the surviving path selection and, for example, the branch metric value with a first path representing one of two possible values for the selection and a second path representing the other of two possible values for the selection. The current selections for the corresponding registers are reflected in a current register depending on where the previous results were pushed.

It will be appreciated that the track buffer will have a depth of $\tau$ which can be around 100 to around 150 representing the number of spin cycles for the track buffer to perform register exchange and the like. It should be noted that the clock rate for an exemplary processor in accordance with various embodiments, is 8.8 nanoseconds and further the track buffer may be provided with a spin signal such as a clock signal, cycle signal, or the like at around the processor clock speed to allow the contents of the track buffer to be updated through register exchange or the like. While the track buffer depth $\tau$ represents a latency in the decision processing for the decoder, it is power efficient in that the buffer contents are exchanged as opposed to iterative and computationally intensive ACS calculations. In an additional step, the accumulated decisions may be voted on to arrive at the most likely decision symbol.

Additional Modifications

As noted above, the present disclosure illustrates and describes an exemplary parallel trellis decoder with $2^{M-1}$ parallel ACS elements for use in a high-speed UWB environment. It will be appreciated that while various values for K and M have been described such as K=6 (M=5), and K=4 (M=3) for illustrative purposes for example, in FIG. 7, different values of K can be used without departing from the invention. It will also be appreciated that the particular implementation of the decoder will be specific to the underlying convolutional code used, for example, to encode symbol sequences and, for a particular value of K, there may be many possible generator polynomials which can be used in an encoder to yield slightly different codes. However, use of $2^{M-1}$ parallel ACS units is consistent with the present invention and any of the slight differences noted above resulting in, for example, slightly different connections can be considered to are intended to fall within the scope of the present invention.

CONCLUSIONS

The disclosed DS-UWB design provides scalable performance across a wide range of application requirements. This design leads to significant reductions in implementation complexity as compared to other proposed UWB PHY designs, while allowing increased scalability to high data-rate and low-power applications. This means that performance for applications such as high-rate data transfers for power-constrained handheld devices can significantly improved relative to current UWB PHY proposals. At the same time, the DS-UWB approach benefits from the significant benefits of true UWB operation, i.e., low fading in multipath, optimal interference characteristics, inherent frequency diversity and precision ranging capabilities.

Although this disclosure discusses a UWB device using the IEEE 802.15.3a standard by way of example, the general design is also applicable to other wireless networks, and should not be considered to be limited to application with respect to IEEE 802.15.3a networks. It should further be noted that while the present invention is applicable to trellis decoding in a UWB device which operates at different speeds and in different modes, the present invention should not be limited to any particular type of decoding operation, but can be used in any decoding situation where a convolutionally encoded symbol is present and for which its features would be advantageous.

This disclosure is intended to explain how to fashion and use various embodiments in accordance with the invention rather than to limit the true, intended, and fair scope and spirit thereof. The foregoing description is not intended to be exhaustive or to limit the invention to the precise form disclosed. Modifications or variations are possible in light of the above teachings. The embodiment(s) was chosen and described to provide the best illustration of the principles of the invention and its practical application, and to enable one of ordinary skill in the art to utilize the invention in various embodiments and with various modifications as are suited to the particular use contemplated. All such modifications and variations are within the scope of the invention as determined by the appended claims, as may be amended during the pendency of this application for patent, and all equivalents thereof, when interpreted in accordance with the breadth to which they are fairly, legally, and equitably entitled.

What is claimed is:

1. An integrated circuit capable of conducting a decoding operation on a received sequence of k symbols, the received sequence presumed to include an encoded message sequence of n symbols encoded according to a convolutional code of rate n/k, having a constraint K, and having $2^M$ code states, where M is equal to K−1, the received sequence received according to a symbol rate associated with the encoded message sequence, the integrated circuit comprising:

$2^{M-1}$ parallel connected Add Compare Select (ACS) elements associated with the $2^M$ code states configured to:
add a number of branch metric values associated with the received sequence to previous path metrics to form added metrics,
compare the added metrics, and
select a surviving path metric to form a selected surviving path metric;

a track buffer track buffer including $2^M$ path registers configured to be capable of storing decisions indicative of the respective selected surviving path metrics from the $2^{M-1}$ parallel connected ACS elements; and a voting unit configured to be capable of generating a decision bit based on the contents of the $2^M$ path registers by voting for the decision bit according to a voting protocol, wherein each of the $2^{M-1}$ parallel connected ACS elements includes two path metric output lines providing ACS decision signals and two path feedback lines providing feedback signals, wherein the two path metric output lines in each of the $2^{M-1}$ parallel connected ACS elements are connected to a track buffer, wherein the two path feedback lines in each of the $2^{M-1}$ parallel connected ACS elements are respectively connected directly as input lines to two different ACS elements selected from the $2^{M-1}$ parallel connected ACS elements, wherein the decoding operation includes a maximum a posteriori (MAP) decoding operation.

2. An integrated circuit, as recited in claim 1, wherein:
the branch metrics associated with the received code symbol include:
$b_{2j,j}(r(t))$, $b_{2j,j+2}{}^{M-1}(r(t))$ and $b_{2j+1,j+2}{}^{M-1}(r(t))$, $b_{2j+1,j}(r(t))$;
each of the $2^M$ parallel ACS element has two Add portions; and
one of the two Add portions adds $b_{2j,j}(r(t))$, $b_{2j,j+2}{}^{M-1}(r(t))$ to a first path metric $P_{2j}(t-1)$ and an other of the two Add portions adds $b_{2j+1,j+2}{}^{M-1}(r(t))$, $b_{2j+1,j}(r(t))$ to a second path metric $P_{2j+1}(t-1)$ to form the added metrics.

3. An integrated circuit, as recited in claim 1, wherein the previous path metrics include $2^M$ output values associated with the $2^{M-1}$ parallel connected ACS units.

4. An integrated circuit, as recited in claim 1, wherein K=6.

5. An integrated circuit, as recited in claim 1, wherein the feedback signals are each one of a previous path metric value, a branch metric value, or a set initialization state input.

6. An integrated circuit, as recited in claim 1, wherein the voting unit, in being configured to be capable of generating a decision bit is further configured to generate the decision bit by cycling the each of the $2^M$ path registers around 100 to around 150 times and wherein the voting protocol includes generating the decision bit based on the contents of a majority of the $2^M$ path registers after the cycling.

7. A method for decoding a received sequence of k symbols, the received sequence presumed to include an encoded message sequence of n symbols encoded according to a convolutional code of rate n/k, having a constraint K, and having $2^M$ code states, where M is equal to K−1, the sequence received according to a symbol rate, the method comprising:
performing, substantially in parallel, $2^{M-1}$ current Add Compare Select (ACS) operations associated with the $2^M$ code states and outputting $2^M$ path metrics to form $2^M$ path metric outputs;
generating $2^M$ feedback outputs based on the $2^{M-1}$ current ACS operations;
providing the $2^M$ path metric outputs to control operation of a track buffer;
providing the $2^M$ feedback outputs directly as inputs to future ACS operations;
storing decisions indicative of $2^M$ path metric outputs in $2^M$ path registers associated with the track buffer; and
generating a decision bit by applying a voting procedure to a decision related content associated with each of the $2^M$ path registers,
wherein the decoding includes maximum a posteriori (MAP) decoding.

8. A method, as recited in claim 7, wherein K=6.

9. A method, as recited in claim 7, wherein the feedback outputs are each one of a previous path metric value, a branch metric value, or a set initialization state input.

10. A method, as recited in claim 7, wherein:
the generating the decision bit further includes cycling the each of the $2^M$ path registers around 100 to around 150 times; and
the voting procedure includes generating the decision bit based on the contents of a majority of the $2^M$ path registers after the cycling.

11. A method, as recited in claim 7, wherein the performing substantially in parallel, the $2^{M-1}$ current Add Compare Select (ACS) operations includes:
adding branch metrics associated with the received sequence and $2^M$ previous path metrics to form added metrics,
comparing the added metrics, and
selecting a surviving path metric to form a selected surviving path metric.

12. A method, as recited in claim 11, wherein the previous path metrics include the path metric outputs.

13. An apparatus configured to be capable of conducting a decoding operation on received sequence of k symbols, the received sequence presumed to include an encoded message sequence of n symbols encoded according to a convolutional code of rate n/k, the convolutional code having a constraint K and $2^M$ code states, where M=K−1, the apparatus comprising:
a memory, and
a processor coupled to the memory, the processor configured to:
input the received sequence according to a symbol rate associated with the message sequence;
perform, substantially in parallel, $2^{M-1}$ current Add Compare Select (ACS) operations associated with the $2^M$ code states;
generate $2^M$ path metric outputs based on the $2^{M-1}$ current ACS operations;
generate $2^M$ feedback outputs based on the $2^{M-1}$ current ACS operations;
provide the $2^M$ feedback outputs directly as input signals for future ACS operations;
store decisions indicative of the $2^M$ path metric outputs in $2^M$ path registers allocated in the memory; and
generate a decision bit based on a voting procedure applied to the $2^M$ path registers,
wherein the decoding operation includes a maximum a posteriori (MAP) decoding operation.

14. A method, as recited in claim 13, wherein K=6.

15. An apparatus, as recited in claim 13, wherein the processor, in the performing, substantially in parallel, the $2^{M-1}$ current ACS operations, is further configured to:
add branch metrics associated with the received sequence to $2^M$ previous path metrics to form added metrics,
compare the added metrics, and
select a surviving path metric to form a selected surviving path metric.

16. An apparatus, as recited in claim 13, wherein the feedback outputs are each one of a previous path metric value, a branch metric value, or a set initialization state input.

17. An apparatus, as recited in claim 13, wherein:
the processor, in the generating the decision bit is further configured to cycle the each of the $2^M$ path registers around 100 to around 150 spin cycles; and
the voting procedure includes the generating the decision bit based on the contents of a majority of the $2^M$ path registers after the cycling.

* * * * *